(12) United States Patent
Nakamura et al.

(10) Patent No.: US 6,614,089 B2
(45) Date of Patent: Sep. 2, 2003

(54) FIELD EFFECT TRANSISTOR

(75) Inventors: Kazutoshi Nakamura, Yokohama (JP); Yusuke Kawaguchi, Miura-gun (JP); Akio Nakagawa, Hiratsuka (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/994,646

(22) Filed: Nov. 28, 2001

(65) Prior Publication Data

US 2002/0030225 A1 Mar. 14, 2002

Related U.S. Application Data

(62) Division of application No. 09/606,179, filed on Jun. 29, 2000.

(51) Int. Cl.[7] .......................... H01L 23/58; H01L 31/119
(52) U.S. Cl. .......................... 257/492; 257/493; 257/341
(58) Field of Search .......................... 257/343, 491–493, 257/338, 335, 492, 341, 355, 500

(56) References Cited

U.S. PATENT DOCUMENTS

| 4,300,150 | A |   | 11/1981 | Colak |
| 4,866,495 | A |   | 9/1989 | Kinzer |
| 5,023,678 | A |   | 6/1991 | Kinzer |
| 5,432,370 | A |   | 7/1995 | Kitamura et al. |
| 5,512,495 | A | * | 4/1996 | Mei et al. |
| 6,069,396 | A | * | 5/2000 | Funaki |
| 6,160,290 | A | * | 12/2000 | Pendharkar et al. |
| 6,376,891 | B1 | * | 4/2002 | Nagatani et al. |

FOREIGN PATENT DOCUMENTS

JP          9-17997          1/1997

OTHER PUBLICATIONS

A.W. Ludikhuize, "High–Voltage DMOS and PMOS In Analog IC'S," IEEE International Electron Devices Meeting 1982, pp. 81–84.
J.S. Ajit, et al., "1200V High–Side Lateral MOSFET in Junction–Isolated Power IC Technology Using Two Field–Reduction Layers," IEEE International Symposium on Power Semiconductor Devices and IC's 1993, pp. 230–235.

* cited by examiner

Primary Examiner—Long Pham
Assistant Examiner—Dilinh Nguyen
(74) Attorney, Agent, or Firm—Oblon, Spivak, McClelland, Maier & Neustadt, P.C.

(57) ABSTRACT

In an N-MOSFET having a Double RESURF structure, an n-drift layer and a p-base layer are formed to be adjacent to each other in the surface of a p-semiconductor active layer. An n+-drain layer and a p-RESURF layer are formed in the surface of the drift layer. An n+-source layer and a p+-contact layer are formed to be adjacent to each other in the surface of the base layer. A gate electrode is arranged through a gate insulating film on that region of the base layer, which is located between the drift layer and the source layer. The RESURF layer is doped with a p-carrier impurity at a dose that is set to be gradually higher from the drain layer side to the base layer side.

9 Claims, 7 Drawing Sheets

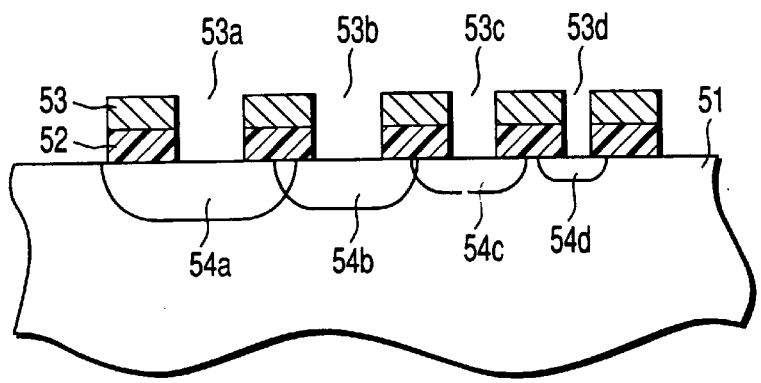
F I G. 19A
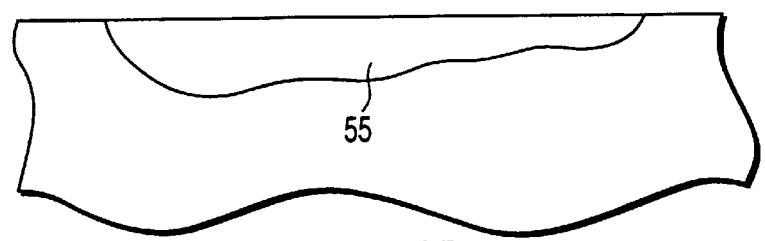
F I G. 19B
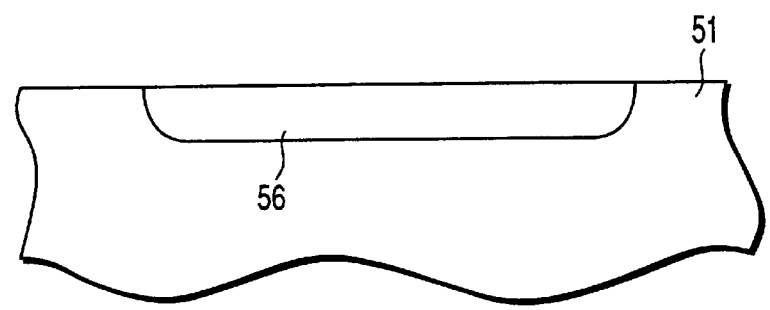
F I G. 20A
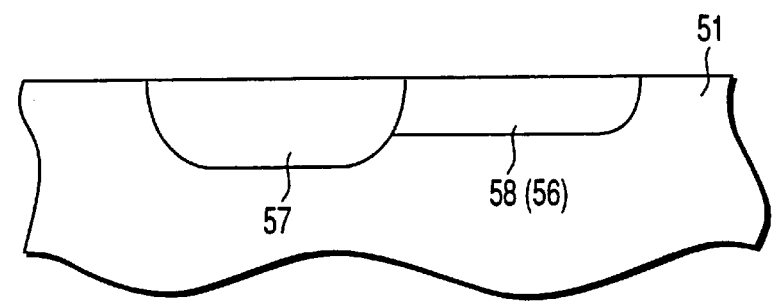
F I G. 20B

FIELD EFFECT TRANSISTOR

CROSS-REFERENCE TO RELATED APPLICATIONS

This application is based upon and claims the benefit of priority from the prior Japanese Patent Application No. 11-186341, filed Jun. 30, 1999, the entire contents of which are incorporated herein by reference.

BACKGROUND OF THE INVENTION

The present invention relates to a field effect transistor, and more particularly to a technique of allowing a field effect transistor having a Double RESURF (Reduced Surface Field) structure to realize a high breakdown voltage.

As a FET (Field Effect Transistor) employing a MOS (Metal Oxide Semiconductor) structure, there is a known device that has a so-called Double RESURF structure wherein a drift layer is formed in the surface of a semiconductor active layer, and a RESURF layer is formed in the surface of the drift layer. For example, an N-MOSFET is fabricated to have an active layer and a RESURF layer, both of which are the p-type, and a drift layer of the n-type. In the MOSFET having such a structure, the n-drift layer is sandwiched by the p-RESURF layer and the p-active layer on the upper and lower sides, respectively, and thus can be easily depleted. Accordingly, the drift layer can be doped with an n-carrier impurity at a higher dose, thereby providing an advantage in that the ON-resistance decreases.

FIG. 21 is a sectional view showing a conventional N-MOSFET having a Double RESURF structure. As shown in FIG. 21, in the surface -of a p-semiconductor active layer 61, an n-drift layer 63 and a p-base layer 65 are formed to be adjacent to each other. An n+-drain layer 67 and a p-RESURF layer 69 are formed in the surface of the drift layer 63. An $n^+$-source layer 71 and a $p^+$-contact layer 73 are formed to be adjacent to each other in the surface of the base layer 65. A gate electrode 76 is arranged through a gate insulating film on that region of the base layer 65, which is located between the drift layer 63 and the source layer 71.

The RESURF layer 69 is arranged in the surface of the drift layer 63 such that it is located between the base layer 65 and the drain layer 67 with gaps relative to the layers 65 and 67 in a direction in which electrons drift. FIG. 22 is a graph showing the profiles of the impurity dose in the drift layer 63 and the RESURF layer 69, corresponding to a region XXII—XXII in FIG. 21. As shown in FIG. 22, each of the RESURF layer 69 and the drift layer 63 is doped with an impurity at a dose substantially uniform from the base layer 65 side to the drain layer 67 side.

According to research conducted by the present inventors, a problem has been found in the MOSFET shown in FIG. 21, in that an electric field is concentrated at the end of the drain layer 67 on the RESURF layer 69 side during the OFF state, and thus it is difficult to obtain a high breakdown voltage. It is thought that a reason for this is that the Double RESURF structure allows the drift layer 63 to be very easily depleted, whereby the electric field is concentrated near the end of the drain layer 67 having a high carrier impurity concentration

BRIEF SUMMARY OF THE INVENTION

The present invention has been made in consideration of the problem of the prior art, and its object is to provide a field effect transistor having a Double RESURF structure, which can not only reduce the resistance in an ON state, i.e., realize a low ON-resistance, but also increase the breakdown voltage in an OFF state, i.e., realize a high breakdown voltage.

According to a first aspect of the present invention, there is provided a field effect transistor comprising:
a semiconductor active layer of a second conductivity type;
a drift layer of a first conductivity type and a base layer of the second conductivity type, which are selectively formed in a surface of the active layer;
a drain layer of the first conductivity type formed in a surface of the drift layer:
a source layer of the first conductivity type formed in a surface of the base layer and separated from the drift layer;
an electric-field-relaxing layer of the second conductivity type formed in the surface of the drift layer and located between the base layer and the drain layer;
a gate electrode arranged through a gate insulating film on a region of the base layer, which is located between the drift layer and the source layer; and
drain and source electrodes electrically connected to the drain and source layers, respectively,
wherein the electric-field-relaxing layer comprises a region doped with a carrier impurity of the second conductivity type at a dose that is set to be lower on the drain layer side than on the base layer side.

According to a second aspect of the present invention, there is provided a field effect transistor comprising:
a semiconductor active layer of a second conductivity type;
a drift layer of a first conductivity type and a base layer of the second conductivity type, which are selectively formed in a surface of the active layer;
a drain layer of the first conductivity type formed in a surface of the drift layer:
a source layer of the first conductivity type formed in a surface of the base layer and separated from the drift layer;
an electric-field-relaxing layer of the second conductivity type formed in the surface of the drift layer and located between the base layer and the drain layer;
a gate electrode arranged through a gate insulating film on a region of the base layer, which is located between the drift layer and the source layer; and
drain and source electrodes electrically connected to the drain and source layers, respectively,
wherein the drift layer comprises a region doped with a carrier impurity of the first conductivity type at a dose that is set to be lower on the base layer side than on the drain layer side.

According to a third aspect of the present invention, there is provided a field effect transistor comprising:
a semiconductor active layer of a first conductivity type;
a drift layer of the first conductivity type and a base layer of a second conductivity type, which are selectively formed in a surface of the active layer;
a drain layer of the first conductivity type formed in a surface of the drift layer:
a source layer of the first conductivity type formed in a surface of the base layer and separated from the drift layer;
an electric-field-relaxing layer of the second conductivity type sandwiched between the drift layer and the active layer and located between the base layer and the drain layer;

a gate electrode arranged through a gate insulating film on a region of the base layer, which is located between the drift layer and the source layer; and drain and source electrodes electrically connected to the drain and source layers, respectively, wherein the electric-field-relaxing layer comprises a region doped with a carrier impurity of the second conductivity type at a dose that is set to be lower on the drain layer side than on the base layer side.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 19A and 19B are views showing a method of forming a gradient of the carrier impurity dose in a layer according to the present invention;

FIGS. 20A and 20B are views showing another method of forming a gradient of the carrier impurity dose in a layer according to the present invention;

DETAILED DESCRIPTION OF THE INVENTION

Figure 1:
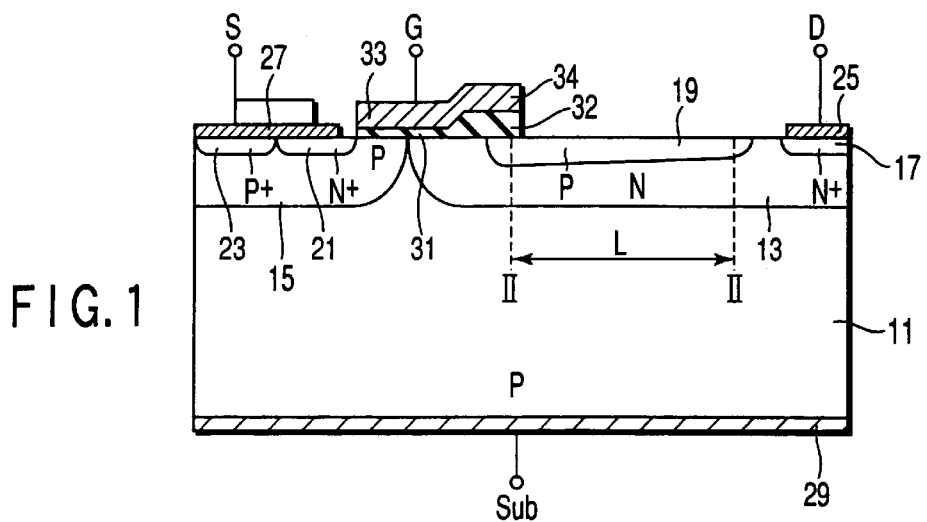
FIG. 1 is a sectional view showing an N-MOSFET according to an embodiment of the present invention.

Embodiments of the present invention will be described hereinafter with reference to the accompanying drawings. In the following description, the constituent elements having substantially the same function and arrangement are denoted by the same reference numerals, and a repetitive description will be made only when necessary.

FIG. 1 is a sectional view showing an N-MOSFET according to an embodiment of the present invention. As shown in FIG. 1, an n-drift layer 13 and a p-base layer 15 are formed to be adjacent to each other in the surface of a p-silicon wafer, i.e., a semiconductor substrate or semiconductor active layer 11. Note that the n-drift layer 13 and the p-base layer 15 are not necessarily formed to be adjacent to each other, but may be separated from each other. An $n^+$-drain layer 17 and a p-RESURF layer or electric-field-relaxing layer 19 are formed in the surface of the drift layer 13. An $n^+$-source layer 21 and a $p^+$-contact layer 23 are formed to be adjacent to each other in the surface of the base layer 15.

A drain electrode 25 is disposed on the drain layer 17, a source electrode 27 is disposed on the source layer 21 and the contact layer 23, and further a bias electrode 29 is disposed on the reverse side of the active layer 11. A gate electrode 33 is arranged through a gate insulating film 31 on that region of the base layer 15, which is located between the drift layer 13 and the source layer 21.

The RESURF layer 19 is arranged in the surface of the drift layer 13 such that it is located between the base layer 15 and the drain layer 17 with gaps relative to the layers 15 and 17 in a direction in which electrons drift. The n-drift layer 13 is sandwiched by the p-RESURF layer 19 and the p-active layer 11 on the upper and lower sides, respectively, and thus can be easily depleted. Accordingly the drift layer 13 can be doped with an n-carrier impurity at a higher dose, thereby reducing the resistance in an ON state, i.e., realizing a low ON-resistance.

The gate electrode 33 includes an extending portion 34 that faces the RESURF layer 19 through an insulating film 32. With this arrangement, the gate electrode 33 and the RESURF layer 19 are capacitively coupled to each other, so that the RESURF layer 19 is prevented from falling into a floating state.

Figure 2:
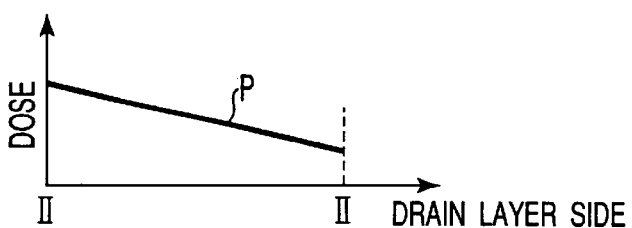
FIG. 2 is a graph showing the profile of the p-carrier impurity dose in a RESURF layer formed in a drift layer, corresponding to a region II—II in FIG. 1.

FIG. 2 is a graph showing the profile of the p-carrier impurity dose in the RESURF layer 19 formed in the drift layer 13, corresponding to a region II—II in FIG. 1. As shown in FIG. 2, the RESURF layer 19 is doped with a p-carrier impurity at a dose that is set to be gradually higher from the drain layer 17 side to the base layer 15 side. Note that in other words the dose can be said to be a value obtained by integrating the p-carrier impurity concentration of the RESURF layer 19 in the depth direction. The gradient of the p-carrier impurity dose in the RESURF layer 19 is set to be from $2\times10^{11}$/L to $5\times10^{12}$/L cm$^{-3}$, and preferably from $5\times10^{11}$/L to $3\times10^{12}$/L cm$^{-3}$, where L is the length (cm) of the RESURF layer 19 (see FIG. 1). Accordingly, with an increase in L, the gradient becomes gentle.

In the MOSFET shown in FIG. 1 having the above described structure, no voltage is applied to the gate electrode 33 during the OFF state, and a voltage the same as that during the ON state is applied between the source electrode 27 and the drain electrode 25. In this state, the portion of the drift layer 13 on the base layer 15 side is easily depleted, because the p-carrier impurity dose in the RESURF layer 19 is higher on this side. On the other hand, the portion of the drift layer 13 on the drain layer 17 side is not easily depleted, because the p-carrier impurity dose in the RESURF layer 19 is lower on this side.

For this reason, a great amount of n-carriers are left in the portion of the drift layer 13 on the drain layer 17 side during the OFF state. The concentration of the n-carriers thus left forms a gradient reverse to that of the p-carrier impurity dose in the RESURF layer 19, i.e., the concentration of the n-carriers is higher on the drain layer 17 side while it becomes lower toward the base layer 15 side and then is depleted. In other words, a great amount of n-carriers are present in the portion of the drift layer 13 near that end of the drain layer 17, which faces the RESURF layer 19, during the OFF state. As a result, an electric field concentration is relaxed on the end of the drain layer 17 having a high carrier impurity concentration, thereby increasing the breakdown voltage in the OFF state, i.e., realizing a high breakdown voltage.

Figure 21:
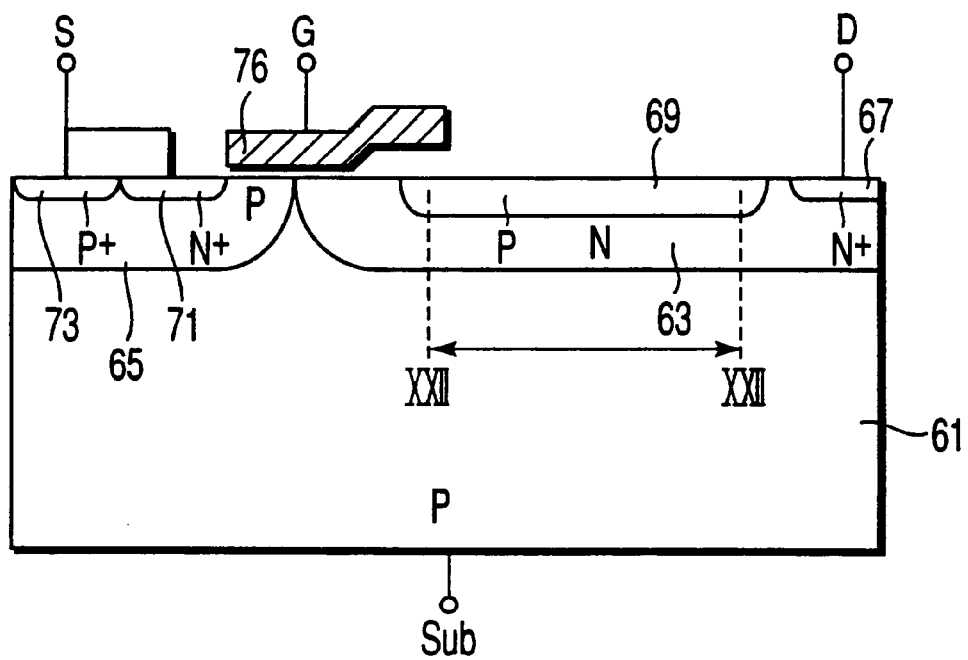
FIG. 21 is a sectional view showing a conventional N-MOSFET having a Double RESURF structure.
Figure 22:
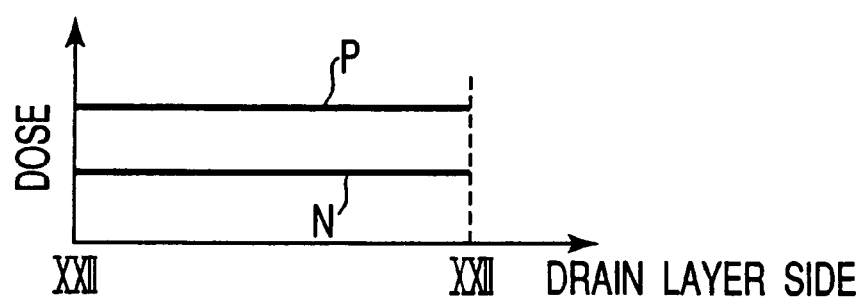
FIG. 22 is a graph showing the profiles of the impurity dose in a drift layer and a RESURF layer, corresponding to a region XXII—XXII in FIG. 21.

The MOSFET shown in FIG. 1 allows the n-carrier impurity dose in the drift layer 13 to be higher than that of the conventional MOSFET shown in FIG. 21. Consequently, it is possible to further reduce the resistance in the ON state.

Figure 3:
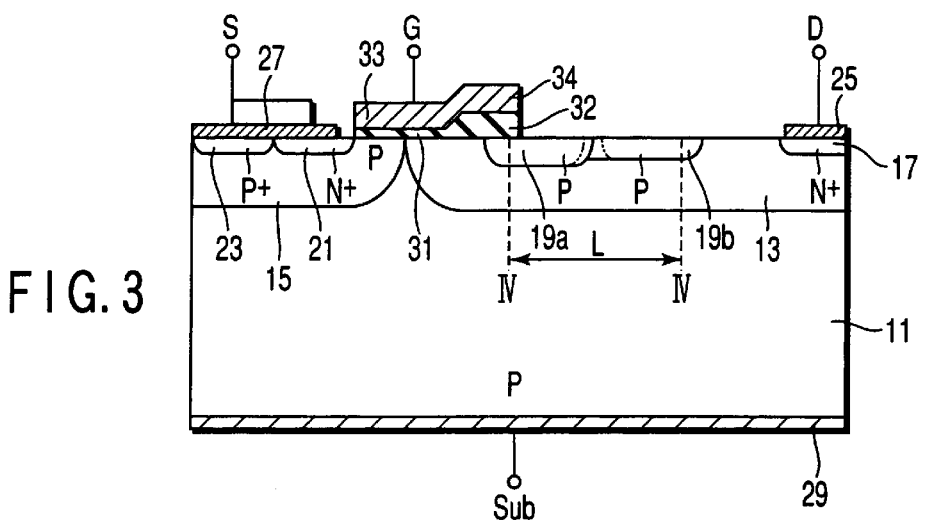
FIG. 3 is a sectional view showing an N-MOSFET according to another embodiment of the present invention.

FIG. 3 is a sectional view showing an N-MOSFET according to another embodiment of the present invention. As shown in FIG. 3, this embodiment differs from the MOSFET shown in FIG. 1 in that there is a RESURF layer comprising two layer portions 19a and 19b formed in the surface of a drift layer 13. The layer portions 19a and 19b are arranged side by side and connected to each other in a direction in which electrons drift.

Figure 4:
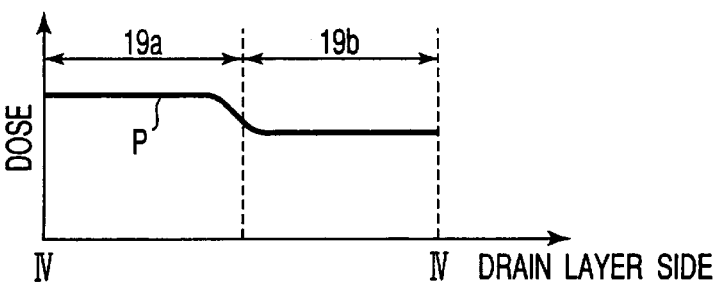
FIG. 4 is a graph showing the profile of the p-carrier impurity dose in RESURF layer portions formed in a drift layer, corresponding to a region IV—IV in FIG. 3.

FIG. 4 is a graph showing the profile of the p-carrier impurity dose in the RESURF layer portions 19a and 19b formed in the drift layer 13, corresponding to a region IV—IV in FIG. 3. As shown in FIG. 4, the RESURF layer portions 19a and 19b are formed such that the layer portion 19b on the drain layer 17 side is doped with a p-carrier impurity at a dose lower than that of the layer portion 19a on the base layer 15 side. The gradient of the p-carrier impurity dose defined by the portions 19a and 19b is set to be from $2\times10^{11}$/L to $5\times10^{12}$/L cm$^{-3}$, and preferably from $5\times10^{11}$/L to $3\times10^{12}$/L cm$^{-3}$, where L is the length (cm) of the RESURF layer portions 19a and 19b (see FIG. 3).

Also in the MOSFET shown in FIG. 3, since the RESURF layer portion 19b is doped with a p-carrier impurity at a lower dose, a great amount of n-carriers are present in the portion of the drift layer 13 near that end of the drain layer 17, which faces the RESURF layer portion 19b, during the OFF state. As a result, an electric field concentration is relaxed on the end of the drain layer 17 having a high carrier impurity concentration, thereby increasing the breakdown voltage in the OFF state, i.e., realizing a high breakdown voltage.

The number of the RESURF layer portions 19a and 19b may be three or more. Besides, the RESURF layer portions 19a and 19b may be formed with a gap therebetween, as shown by the phantom lines in FIG. 3.

Figure 5:
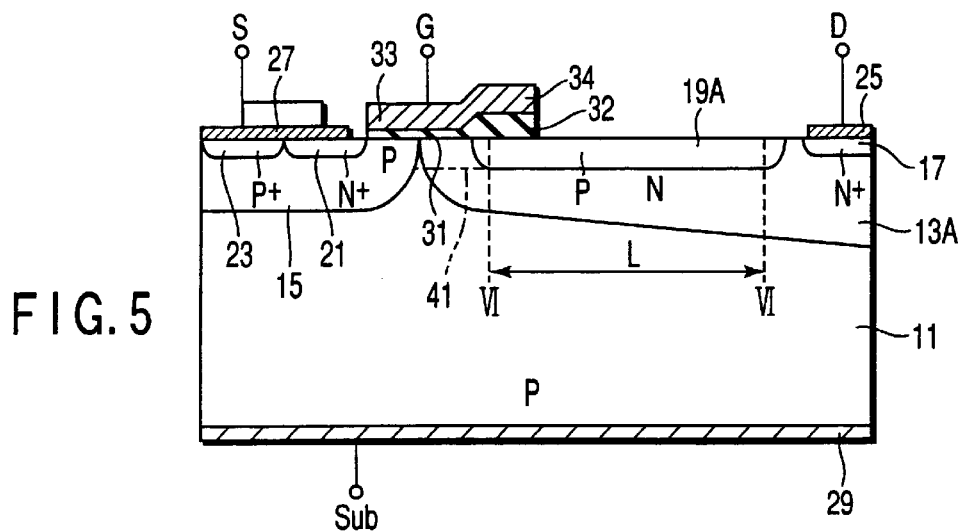
FIG. 5 is a sectional view showing an N-MOSFET according to still another embodiment of the present invention.

FIG. 5 is a sectional view showing an N-MOSFET according to still another embodiment of the present invention. As shown in FIG. 5, this embodiment is provided with a drift layer 13A and a RESURF layer 19A, both different from those of the MOSFET shown in FIG. 1. The RESURF layer 19A is doped with an impurity at a dose substantially uniform within a region VI—VI in FIG. 5. On the other hand, the drift layer 13A is doped with an n-carrier impurity at a dose that is set to be gradually higher from the base layer 15 side to the drain layer 17 side.

Figure 6:
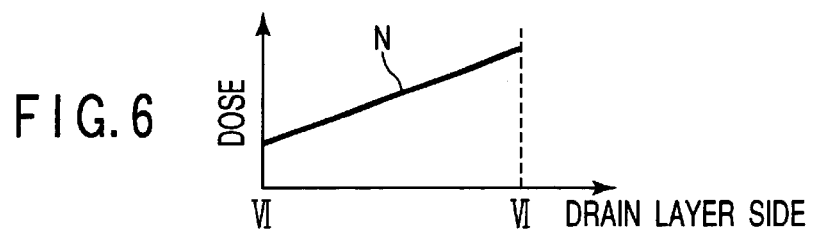
FIG. 6 is a graph showing the profile of the n-carrier impurity dose in a drift layer, corresponding to a region VI—VI in FIG. 5.

FIG 6 is a graph showing the profile of the n-carrier impurity dose in the drift layer 13A, corresponding to the region VI—VI in FIG. 5. The gradient of the n-carrier impurity dose in the drift layer 13A is set to be from $2\times10^{11}$/L to $9\times10^{12}$/L cm$^{-3}$, and preferably from $5\times10^{11}$/L to $5\times10^{12}$/L cm$^{-3}$, where L is the length (cm) of the drift layer 13A (see FIG. 5).

Also in the MOSFET shown in FIG. 5, a great amount of n-carriers are present in the portion of the drift layer 13 near the end of the drain layer 17, during the OFF state. As a result, an electric field concentration is relaxed on the end of the drain layer 17 having a high carrier impurity concentration. Furthermore, in this structure, depletion of the RESURF layer 19 is further promoted. As a result, it is possible to increase the breakdown voltage in the OFF state, i.e., realize a high breakdown voltage.

Figure 7:
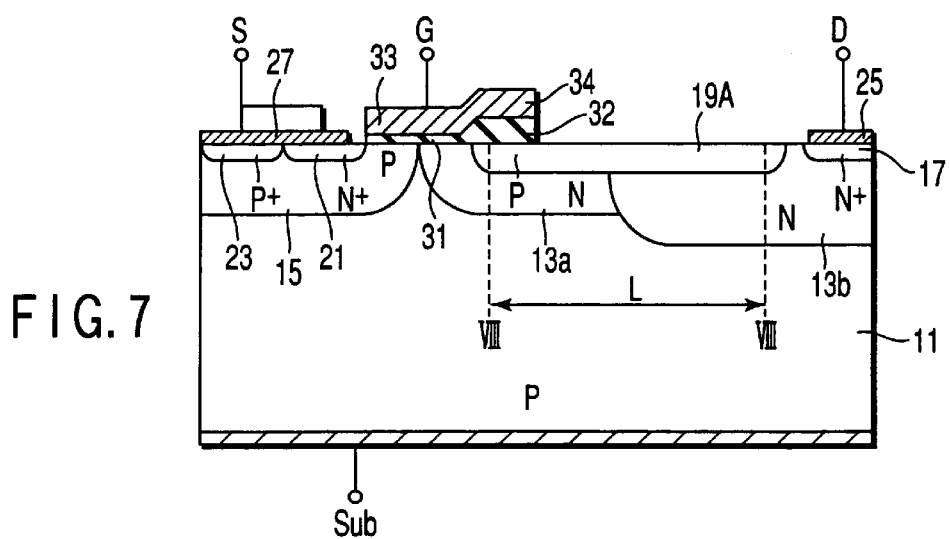
FIG. 7 is a sectional view showing an N-MOSFET according to still another embodiment of the present invention.

FIG. 7 is a sectional view showing an N-MOSFET according to still another embodiment of the present invention. As shown in FIG. 7, this embodiment differs from the MOSFET shown in FIG. 5 in that there is a drift layer comprising two layer portions 13a and 13b. The layer portions 13a and 13b are arranged side by side and connected to each other in a direction in which electrons drift.

Figure 8:
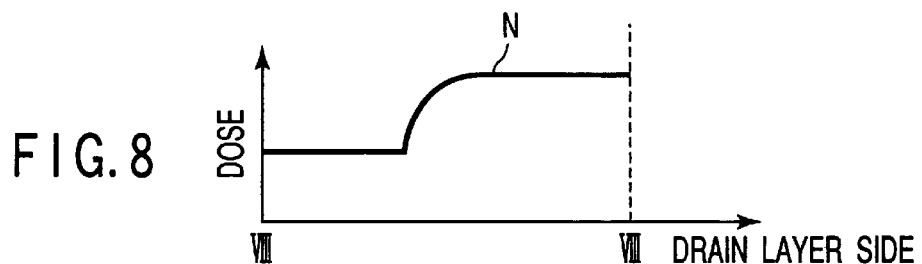
FIG. 8 is a graph showing the profile of the n-carrier impurity dose in drift layer portions, corresponding to a region VIII—VIII in FIG. 7.

FIG. 8 is a graph showing the profile of the n-carrier impurity dose in the drift layer portions 13a and 13b, corresponding to a region VIII—VIII in FIG. 7. As shown in FIG. 8, the drift layer portions 13a and 13b are formed such that the layer portion 13b on the drain layer 17 side is doped with an n-carrier impurity at a dose higher than that of the layer portion 13a on the base layer 15 side. The gradient of the n-carrier impurity dose defined by the portions 13a and 13b is set to be from $2\times10^{11}$/L to $9\times10^{12}$/L cm$^{-3}$, and preferably from $5\times10^{11}$/L to $5\times10^{12}$/L cm$^{-3}$, where L is the length (cm) of the drift layer portions 13a and 13b (see FIG. 7).

The MOSFET shown in FIG. 7 can also realize both of a low ON-resistance and a high breakdown voltage, as in the MOSFET shown in FIG. 5. The number of the drift layer portions 13a and 13b may be three or more.

Figure 9:
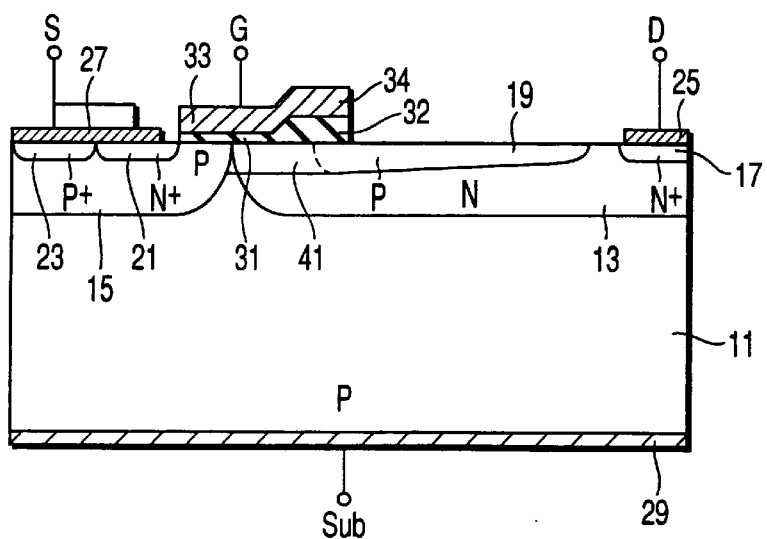
FIG. 9 is a sectional view showing an N-MOSFET according to still another embodiment of the present invention.
Figure 10:
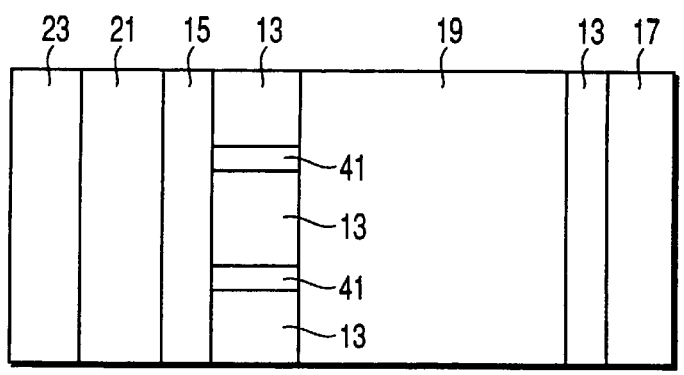
FIG. 10 is a plan view showing the MOSFET shown in FIG. 9 while omitting the electrodes.

FIGS. 9 and 10 are a sectional view showing an N-MOSFET according to still another embodiment of the present invention, and a plan view showing the MOSFET while omitting the electrodes, respectively. As shown in FIGS. 9 and 10, this embodiment includes a plurality of p-partly-connecting layers 41 formed in the surface of a drift layer 13 in a ladder shape format between a base layer 15 and a RESURF layer 19, in addition to the structure of the MOSFET shown in FIG. 1. The RESURF layer 19 is electrically connected to the base layer 15 through the p-partly-connecting layers 41, and thus is fixed to the potential of a source electrode 27.

Note that, also in the MOSFET shown in FIG. 3, 5 or 7, the RESURF layer portion 19a or the RESURF layer 19A may be electrically connected to the base layer 15 by the p-partly-connecting layers 41 (see the phantom line 41 in FIG. 5), so that the advantage of this embodiment is obtained.

Figure 11:
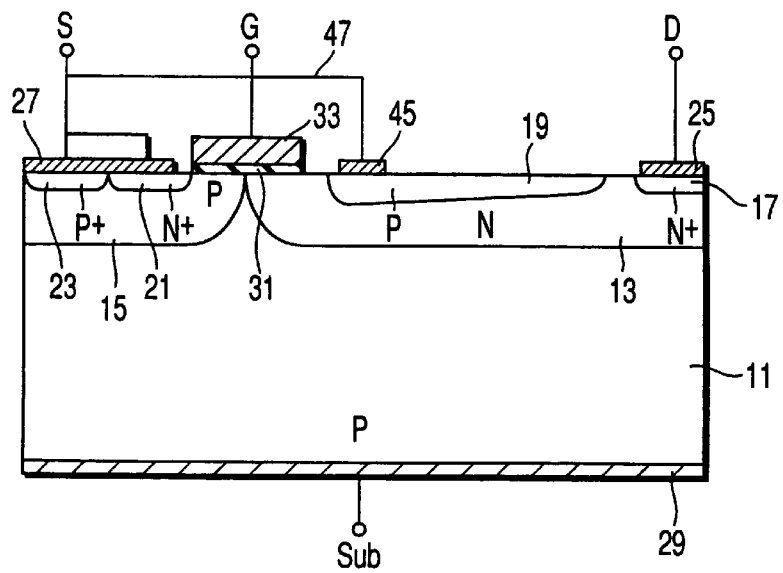
FIG. 11 is a sectional view showing an N-MOSFET according to still another embodiment of the present invention.

FIG. 11 is a sectional view showing an N-MOSFET according to still another embodiment of the present invention. As shown in FIG. 11, this embodiment includes an electrode 45 disposed on a RESURF layer 19 and connected to a source electrode 27 through a wiring layer 47, in addition to the structure of the MOSFET shown in FIG. 1. For example, the wiring layer 47 is disposed above the gate electrode 33 with an inter-level insulating film sandwiched therebetween. The RESURF layer 19 is electrically connected to the source electrode 27 through the electrode 45 and the wiring layer 47, and thus is fixed to the potential of the source electrode 27.

Note that, also in the MOSFET shown in FIG. 3, 5 or 7, the RESURF layer portion 19a or the RESURF layer 19A may be electrically connected to the source electrode 27 by the electrode 45 and the wiring layer 47, so that the advantage of this embodiment is obtained.

Figure 12:
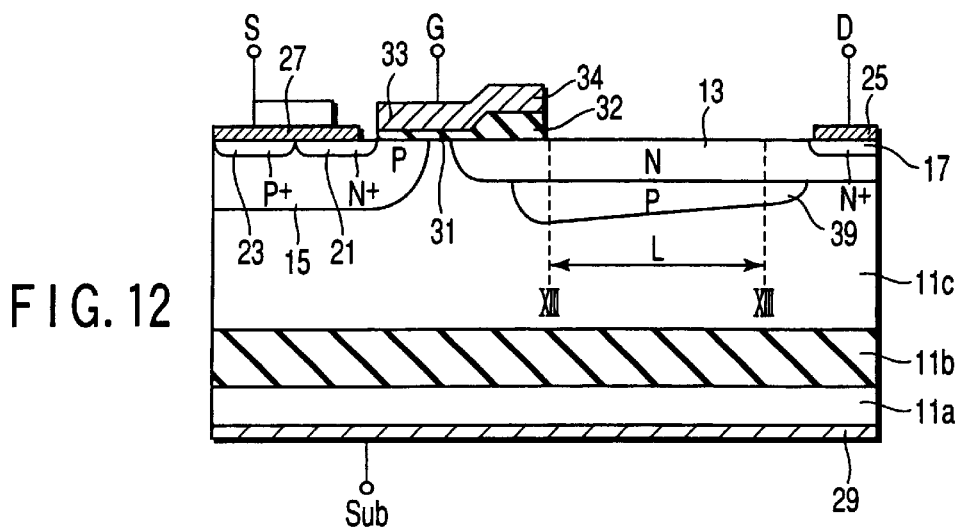
FIG. 12 is a sectional view showing an N-MOSFET according to still another embodiment of the present invention.

FIG. 12 is a sectional view showing an N-MOSFET according to still another embodiment of the present invention.

As shown in FIG. 12, an n-semiconductor active layer 11c is disposed through an insulating film (embedded oxide film) 11b on the surface of a semiconductor supporting substrate 11a. In the surface of the semiconductor active layer 11c, an n-drift layer 13 and a p-base layer 15 are selectively formed. A p-electric-field-relaxing layer 39 is formed under the drift layer 13 to be separated from the base layer 15. An n$^+$-drain layer 17 is formed in the surface of the drift layer 13. An n$^+$-source layer 21 and a p$^+$-contact layer 23 are formed to be adjacent to each other in the surface of the base layer 15.

A drain electrode 25 is disposed on the drain layer 17, a source electrode 27 is disposed on the source layer 21 and the contact layer 23, and further a bias electrode 29 is disposed on the supporting substrate 11a. A gate electrode 33 is arranged through a gate insulating film 31 on that region of the base layer 15, which is located between the drift layer 13 and the source layer 21.

Figure 13:
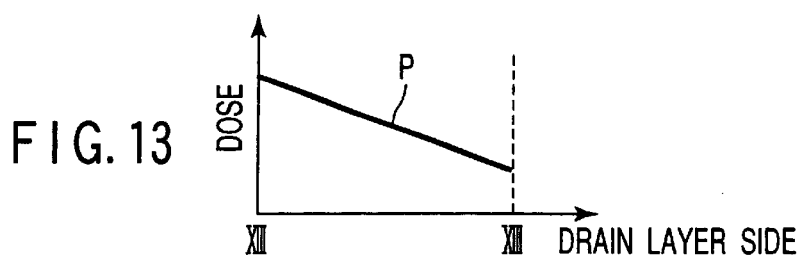
FIG. 13 is a graph showing the profile of the p-carrier impurity dose in an electric-field-relaxing layer, corresponding to a region XIII—XIII in FIG. 12.

The electric-field-relaxing layer 39 is sandwiched between the drift layer 13 and the active layer 11c such that it is located between the base layer 15 and the drain layer 17 in a direction in which electrons drift. FIG. 13 is a graph showing the profile of the p-carrier impurity dose in the electric-field-relaxing layer 39, corresponding to a region XIII—XIII in FIG. 12. As shown in FIG. 13, the electric-field-relaxing layer 39 is doped with a p-carrier impurity at a dose that is set to be gradually higher from the drain layer 17 side to the base layer 15 side. The gradient of the p-carrier impurity dose in the electric-field-relaxing layer 39 is set to be from $2 \times 10^{11}/L$ to $9 \times 10^{12}/L$ cm$^{-3}$, and preferably from $5 \times 10^{11}/L$ to $5 \times 10^{12}/L$ cm$^{-3}$, where L is the length (cm) of the electric-field-relaxing layer 39 (see FIG. 12).

In the MOSFET shown in FIG. 12 having the above described structure, a great amount of n-carriers are present in the portions of the drift layer 13 near the end of the drain layer 17 and near that end of the active layer 11c adjacent to the drain layer 17, during the OFF state. As a result, an electric field concentration is relaxed in the region having a high n-carrier impurity concentration, thereby realizing a high breakdown voltage. Furthermore, since the active layer 11c is formed on the insulating film 11b, the active layer 11c is depleted from both the electric-field-relaxing layer 39 and the insulating film 11b, and thus is easily depleted. Accordingly, the active layer 11c can be doped with an n-carrier impurity at a higher dose, thereby reducing the resistance in an ON state, i.e., realizing a low ON-resistance.

Note that, also in the MOSFET shown in FIG. 12, the electric-field-relaxing layer 39 may be electrically connected to the base layer 15 by a p-partly-connecting layer, or may be electrically connected to a source electrode 27 by a wiring layer, so that the electric-field-relaxing layer 39 is fixed to the potential of the source electrode 27, as described with reference to FIGS. 9 to 11.

Figure 14:
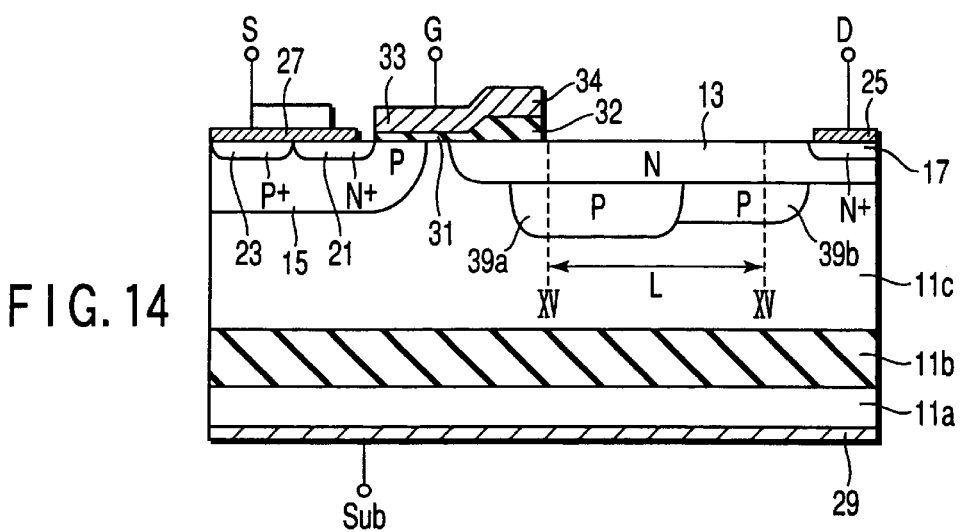
FIG. 14 is a sectional view showing an N-MOSFET according to still another embodiment of the present invention.

FIG. 14 is a sectional view showing an N-MOSFET according to still another embodiment of the present invention. As shown in FIG. 14, this embodiment differs from the MOSFET shown in FIG. 12 in that there is an electric-field-relaxing layer comprising two layer portions 39a and 39b. The layer portions 39a and 39b are arranged side by side and connected to each other in a direction in which electrons drift.

Figure 15:
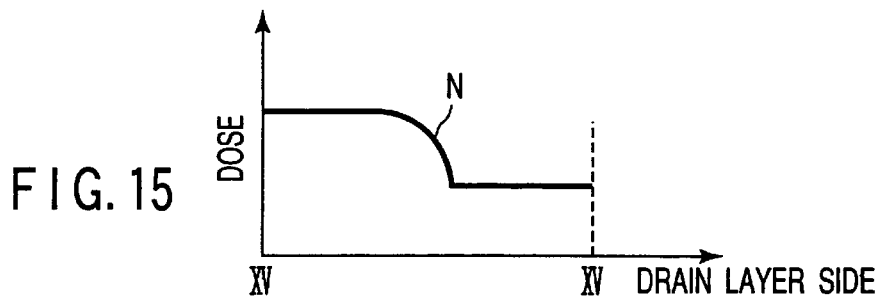
FIG. 15 is a graph showing the profile of the p-carrier impurity dose in electric-field-relaxing layer portions, corresponding to a region XV—XV in FIG. 14.

FIG. 15 is a graph showing the profile of the p-carrier impurity dose in the electric-field-relaxing layer portions 39a and 39b, corresponding to a region XV—XV in FIG. 14. As shown in FIG. 15, the electric-field-relaxing layer portions 39a and 39b are formed such that the layer portion 39b on the drain layer 17 side is doped with a p-carrier impurity at a dose lower than that of the layer portion 39a on the base layer 15 side. The gradient of the p-carrier impurity dose defined by the portions 39a and 39b is set to be from $2 \times 10^{11}/L$ to $9 \times 10^{12}/L$ cm$^{-3}$, and preferably from $5 \times 10^{11}/L$ to $5 \times 10^{12}/L$ cm$^{-3}$, where L is the length (cm) of the electric-field-relaxing layer portions 39a and 39b (see FIG. 14).

The MOSFET shown in FIG. 14 can also realize both of a low ON-resistance and a high breakdown voltage, as in the MOSFET shown in FIG. 12. The number of the electric-field-relaxing layer portions 39a and 39b may be three or more. Besides, the electric-field-relaxing layer portions 39a and 39b may be formed with a gap therebetween.

Note that, also in the MOSFET shown in FIG. 14, the electric-field-relaxing layer portion 39a may be electrically connected to the base layer 15 by a p-partly-connecting layer, or may be electrically connected to a source electrode 27 by a wiring layer, so that the electric-field-relaxing layer portions 39a and 39b are fixed to the potential of the source electrode 27, as described with reference to FIGS. 9 to 11.

Figure 16:
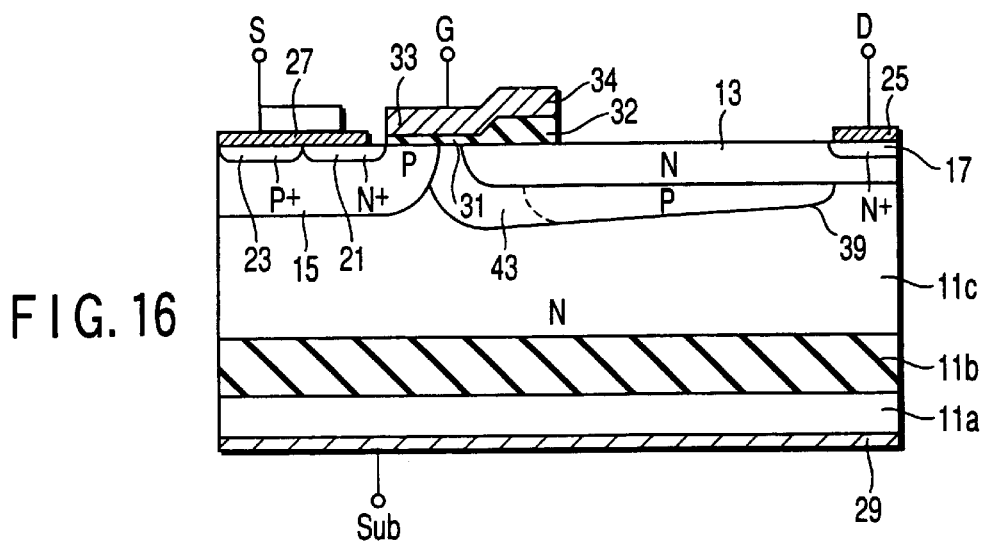
FIG. 16 is a sectional view showing an N-MOSFET according to still another embodiment of the present invention.
Figure 17:
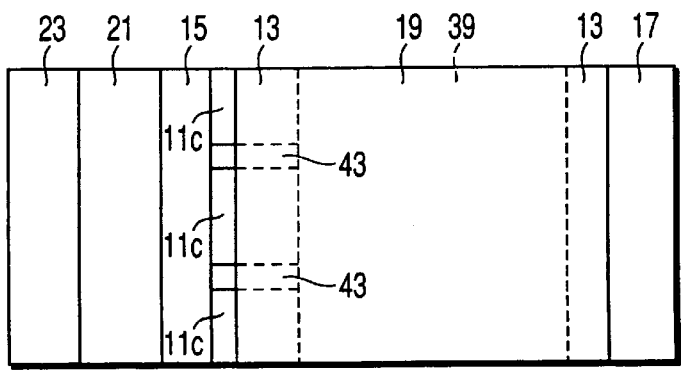
FIG. 17 is a plan view showing the MOSFET shown in FIG. 16 while omitting the electrodes.

FIGS. 16 and 17 are a sectional view showing an N-MOSFET according to still another embodiment of the present invention, and a plan view showing the MOSFET while omitting the electrodes, respectively. As shown in FIGS. 16 and 17, this embodiment includes a plurality of p-partly-connecting layers 43 formed in the surface of a semiconductor active layer 11c in a ladder shape format between a base layer 15 and an electric-field-relaxing layer 39, in addition to the structure of the MOSFET shown in FIG. 12. The electric-field-relaxing layer 39 is electrically connected to the base layer 15 through the p-partly-connecting layers 43, and thus is fixed to the potential of a source electrode 27.

Note that, also in the MOSFET shown in FIG. 14, the electric-field-relaxing layer portion 39a may be electrically connected to the base layer 15 by the p-partly-connecting layers 43, so that the advantage of this embodiment is obtained.

Figure 18:
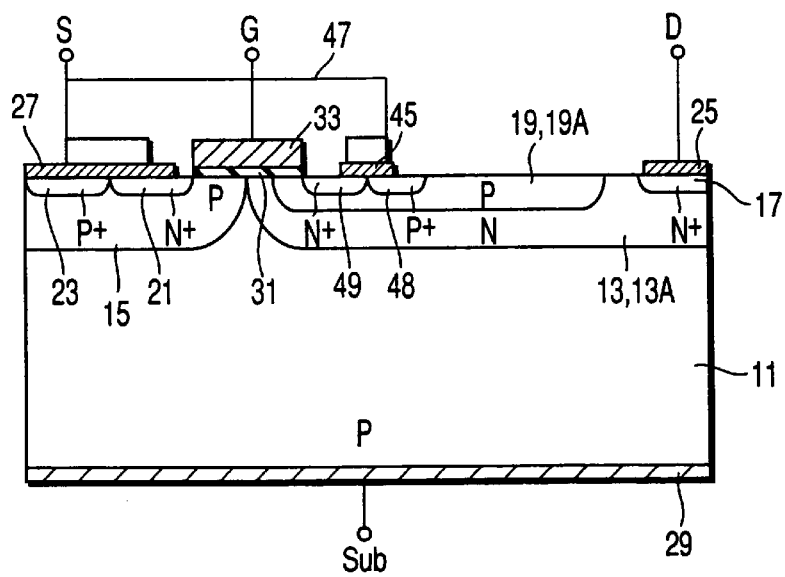
FIG. 18 is a sectional view showing an N-MOSFET according to still another embodiment of the present invention.

FIG. 18 is a sectional view showing an N-MOSFET according to still another embodiment of the present invention. As shown in FIG. 18, this embodiment includes an electrode 45 disposed on a RESURF layer 19 or 19A and connected to a source electrode 27 through a wiring layer 47, in addition to the structure of the MOSFET shown in FIG. 1 or 5. The RESURF layer 19 or 19A extends to a position under a gate electrode 33, and a p$^+$-contact layer 48 and an n$^+$-auxiliary source layer 49 are formed to be adjacent to each other in the surface of the RESURF layer 19 or 19A. The contact layer 48 and the auxiliary source layer 49 are arranged in contact with the electrode 45, and connected to the source electrode 27 through the electrode 45 and the wiring layer 47.

In this arrangement, channels are formed during the ON state, not only in the surface of a base layer 15 between a source layer 21 and a drift layer 13 or 13A, but also in the surface of the RESURF layer 19 or 19A between the auxiliary source layer 49 and the drift layer 13 or 13A. As a result, the channel width substantially expands, thereby reducing the resistance in an ON state, i.e., realizing a low ON-resistance.

Note that, also in the MOSFET shown in FIG. 3 or 7, the RESURF layer portion 19a or the RESURF layer 19A may be provided with a modification relating to the auxiliary source layer 49, so that the advantage of this embodiment is obtained.

In the above described embodiments, the profile of a carrier impurity dose, which decreases gradually, in any one of the RESURF layer 19, the drift layer 13A, and the electric-field-relaxing layer 39, may be realized by a method shown in FIGS. 19A and 19B, or FIGS. 20A and 20B.

In the method shown in FIG. 19A and 19B, a mask 53 used for ion-implanting an impurity into a substrate 51 (reference symbol 52 denotes a resist layer) includes openings 53a to 53d, which gradually decrease in size in accordance with the profile of, e.g., the RESURF layer 19. More specifically, the openings 53a to 53d are set to be larger with an increase in the carrier impurity concentration, or to be smaller with a decrease in the carrier impurity concentration.

Using this mask 53, for example, the RESURF layer 19 is ion-implanted with a p-carrier impurity in one step, so that a plurality of implanted layers 54a to 54d are formed in the surface of the substrate 51 (FIG. 19A). Then, the impurity in the implanted layers 54a to 54d is diffused to each other by a heat treatment, so that a layer 55 having a gradient of the carrier impurity dose is formed (FIG. 19B).

On the other hand, in the method shown in FIG. 20A and 20B, a diffusion layer 56 having a low impurity dose is first formed in the surface of a substrate 51 in the first step (FIG. 20A). Then, a diffusion layer 57 having a high impurity dose is formed through part of the diffusion layer 56 in the second step (FIG. 20B), so that two diffusion layers 57 and 58 having higher and lower impurity doses are arranged side by side. If necessary, other diffusion layers having still higher impurity doses are sequentially formed in additional steps. Furthermore, if necessary, a heat treatment is performed to diffuse the impurity in the layers 57 and 58 to each other.

The method shown in FIG. 20A and 20B is suitable especially for the MOSFET shown in FIG. 3, 7, or 14, in which the gradient of a carrier impurity dose in the RESURF layer, the drift layer, or the electric-field-relaxing layer is defined by a plurality of layer portions 19a and 19b, 13a and 13b, or 39a and 39b.

In all the embodiments described above, the MOSFETs may be formed using either a general mono-crystalline substrate or an SOI (Silicon On Insulator) substrate. The material of the semiconductor active layers is not limited to silicon, but may be another semiconductor material. The material of an insulating film used in the MOS structures is not limited to an oxide, but may be another insulator to constitute a so-called MIS (Metal Insulator Semiconductor) structure.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A field effect transistor comprising:
   a semiconductor active layer of a first conductivity type;
   a drift layer of the first conductivity type and a base layer of a second conductivity type, which are selectively formed in a surface of the active layer;
   a drain layer of the first conductivity type formed in a surface of the drift layer;
   a source layer of the first conductivity type formed in a surface of the base layer and separated from the drift layer;
   an electric-field-relaxing layer of the second conductivity type sandwiched between the drift layer and the active layer in a vertical direction and located between the base layer and the drain layer in a horizontal direction, the electric-field-relaxing layer being disposed such that the drift layer and the active layer are in contact with each other on both sides of the electric-field-relaxing layer facing the base layer and the drain layer;
   a gate electrode arranged through a gate insulating film on a region of the base layer, which is located between the drift layer and the source layer; and
   drain and source electrodes electrically connected to the drain and source layers,
   wherein the electric-field-relaxing layer comprises a region doped with a carrier impurity of the second conductivity type at a dose that is set to be lower on the drain layer side than on the base layer side.

2. The transistor according to claim 1, wherein the electric-field-relaxing layer comprises a region doped with a carrier impurity of the second conductivity type at a dose that is set to be gradually higher from the drain layer side to the base layer side.

3. The transistor according to claim 1, wherein the electric-field-relaxing layer comprises a plurality of layer portions including first and second layer portions located on the base layer side and the drain layer side, respectively, such that the second layer portion is doped with a carrier impurity of the second conductivity type at a dose lower than that of the first layer portion.

4. The transistor according to claim 1, wherein the gate electrode is arranged through the gate insulating film on the region of the base layer, and a region of the active layer, which are located between the drift layer and the source layer.

5. The transistor according to claim 1, wherein the base layer is electrically connected to the source electrode.

6. The transistor according to claim 5, wherein the electric-field-relaxing layer is electrically connected to the base layer by a partly-connecting layer of the second conductivity type formed in the surface of the active layer.

7. The transistor according to claim 6, wherein the partly-connecting layer comprises a plurality of portions formed in the active layer in a ladder shape format.

8. The transistor according to claim 1, wherein the drift layer and the electic-field-relaxing layer form a first pn junction, and the active layer and the electric-field-relaxing layer form a second pn junction, the first and second pn junctions being disposed at upper and lower positions, respectively, in a depth direction of the active layer.

9. The transistor according to claim 1, wherein the active layer is disposed on a semiconductor support layer through an insulating film.

* * * * *